United States Patent
Keto

(10) Patent No.: US 10,513,776 B2
(45) Date of Patent: Dec. 24, 2019

(54) METHOD FOR COATING A SUBSTRATE

(71) Applicant: BENEQ OY, Espoo (FI)

(72) Inventor: Leif Keto, Espoo (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 16/311,242

(22) PCT Filed: Jun. 30, 2017

(86) PCT No.: PCT/FI2017/050497
§ 371 (c)(1),
(2) Date: Dec. 19, 2018

(87) PCT Pub. No.: WO2018/002450
PCT Pub. Date: Jan. 4, 2018

(65) Prior Publication Data
US 2019/0186010 A1    Jun. 20, 2019

(30) Foreign Application Priority Data
Jun. 30, 2016 (FI) ........................... 20165543

(51) Int. Cl.
*C23C 16/455* (2006.01)
*C23C 16/54* (2006.01)

(52) U.S. Cl.
CPC .. *C23C 16/45529* (2013.01); *C23C 16/45551* (2013.01); *C23C 16/545* (2013.01)

(58) Field of Classification Search
CPC ............ C23C 16/455; C23C 16/45525; C23C 16/45527; C23C 16/54; H01L 21/0228
See application file for complete search history.

(56) References Cited

U.S. PATENT DOCUMENTS

| 2007/0224348 A1* | 9/2007 | Dickey ............. C23C 16/45551 427/248.1 |
| 2010/0189900 A1* | 7/2010 | Dickey ............. C23C 16/45551 427/255.5 |

(Continued)

FOREIGN PATENT DOCUMENTS

| WO | 2016005661 A1 | 1/2016 |
| WO | 2016102771 A1 | 6/2016 |

OTHER PUBLICATIONS

Soderlund, Mikko, "Opportunities, Challenges, and Solutions for ALD Encapsulation in Flexible Electronics Applications". Beneq powerpoint presentation for ALD for Industry Workshop; Dresdon, Germany, Jan. 2017, pp. 1-13.*

(Continued)

*Primary Examiner* — Bret P Chen
(74) *Attorney, Agent, or Firm* — Robert P. Michal, Esq.; Carter, DeLuca & Farrell LLP

(57) ABSTRACT

A method for subjecting a surface of a substrate to successive surface reactions of precursors according to the principles of atomic layer deposition includes subjecting the surface of the substrate to the first precursor in a first precursor zone and subjecting the surface of the substrate to the second precursor in a second precursor zone, changing the first precursor in the first precursor zone to a subsequent precursor which is different than the first and second precursors, subjecting the surface of the substrate to the subsequent precursor in the first precursor zone, and subjecting the surface of the substrate to the second precursor in the second precursor zone.

17 Claims, 8 Drawing Sheets

(56) References Cited

U.S. PATENT DOCUMENTS

| | | | |
|---|---|---|---|
| 2010/0284123 A1* | 11/2010 | Pulugurtha | B82Y 10/00 361/271 |
| 2012/0028410 A1* | 2/2012 | Marsh | C23C 16/305 438/102 |
| 2012/0171378 A1* | 7/2012 | Xiao | C23C 16/305 427/255.35 |
| 2012/0231164 A1* | 9/2012 | Thompson | C07F 13/005 427/252 |
| 2013/0143415 A1 | 6/2013 | Yudovsky et al. | |
| 2015/0031195 A1* | 1/2015 | Kim | H01L 21/28088 438/589 |
| 2015/0099359 A1* | 4/2015 | Londergan | C23C 16/45502 438/680 |
| 2015/0107510 A1* | 4/2015 | Lindfors | C23C 16/45544 117/98 |
| 2015/0152552 A1* | 6/2015 | Enholm | C23C 16/45551 118/730 |
| 2015/0167164 A1* | 6/2015 | Jauhiainen | C23C 16/45551 427/255.28 |

OTHER PUBLICATIONS

Poodt, Paul, et al., "Spatial atomic layer deposition: A route towards further industrialization of atomic layer deposition". Review Article for J. Vac. Sci. Technol. A 30(1), Jan./Feb. 2012, 010802, pp. 1-11.*
Johnson, Richard W., et al., "A brief review of atomic layer deposition" from fundamentals to applications. Materials Today, vol. 17, No. 5, Jun. 2014, pp. 236-246.*
Munoz-Rojas, David, et al., "Spatial atmospheric atomic layer deposition: a new laboratory and industrial tool for low-cost photovoltaics". Materials Horizons, 2014, 1, 314-320.*
Arkles, Barry, et al., "Understanding ALD, MLD, and SAMs as they enter the fab". Deposition, pp. 1-3. No date available.*
International Search Report issued by the Finnish Patent and Registration Office acting as the International Searching Authority in relation to International Application No. PCT/FI2017/050497 dated Oct. 30, 2017 (4 pages).
Written Opinion of the International Searching Authority issued by the Finnish Patent and Registration Office acting as the International Searching Authority in relation to International Application No. PCT/FI2017/050497 dated Oct. 30, 2017 (7 pages).

* cited by examiner

METHOD FOR COATING A SUBSTRATE

CROSS-REFERENCE TO RELATED APPLICATIONS

This application is a National Phase Entry of PCT International Application No. PCT/FI2017/050497 filed Jun. 30, 2017, which claims priority to Finnish Patent Application No. 20165543, filed on Jun. 30, 2016, the disclosure of each application is expressly incorporated herein by reference in their entirety.

FIELD OF THE INVENTION

The present invention relates to a method and an apparatus for subjecting a surface of a substrate to successive surface reactions of at least a first precursor, a second precursor and a subsequent precursor according to the principles of atomic layer deposition for forming on the surface of the substrate a coating comprising two or more different coating layers.

BACKGROUND OF THE INVENTION

Atomic layer deposition (ALD) is conventionally carried out in a reaction chamber under vacuum conditions. One or more substrates are first loaded into the reaction chamber and then vacuum is provided or sucked into the reaction chamber and the reaction space inside the reaction chamber is heated to process temperature. The atomic layer deposition is then carried out by supplying and pulsing first and second gaseous precursors into the reaction chamber alternatingly and repeatedly for providing a coating layer with desired thickness on the surface of the substrate. A full ALD cycle, in which the first and second precursor are supplied into the reaction chamber comprises: supplying a pulse of first precursor into the reaction chamber, purging the first precursor from the reaction chamber, supplying a pulse of second precursor into the reaction chamber and purging the second precursor from the reaction chamber. Purging precursors may comprise discharging the precursor material from the reaction chamber, supplying purge gas, such as nitrogen, into the reaction chamber and discharging the purge gas. When desired number of ALD cycles and thus a desired coating layer thickness is reached, the vacuum in the reaction chamber is released and the substrates are unloaded from the reaction chamber. Then the same process is repeated for the next substrates.

An alternative way of providing coating layers on a substrate with ALD is using movable nozzle head which comprise at least one first precursor nozzle for supplying first precursor on the surface of the substrate, at least one second precursor nozzle for supplying second precursor on the surface of the substrate and at least one discharge channel for discharging the precursors from the surface of the substrate. The nozzle head comprises on output face to which the precursor nozzles and the discharge channels are provided. The nozzle head is arranged over a surface of the substrate to be coated and moved in reciprocating or similar manner over the surface in relation to the substrate. The relative movement of the substrate and the nozzle head may be carried out by moving the substrate or the nozzle head over alternatively moving both the substrate and the nozzle head in relation to each other. The precursors are supplied continuously and uninterruptedly from the precursor nozzles and also discharged to discharge channels. The relative movement and continuous supply of the precursors subjects the surface of the substrate alternatively and repeatedly to the first and second precursors and grows coating layers on the surface of the substrate.

The disadvantage of the prior art ALD coating methods and apparatuses is that forming coatings having different coating layers, meaning nanolaminate coatings, is difficult. The methods and apparatuses are designed to for only coating layers having one type of coating layer. Forming nanolaminates requires disrupting the coating process and adjusting the apparatus in order to form a different coating layer. When the coating is formed in a reaction chamber, the used starting materials have to be changed and the supply of the precursors have to be disrupted. If nanolaminates are produced with prior art nozzle heads without disrupting coating process, the nozzle head have to have extremely large number of precursor nozzles, as the nanolaminate structure is defined by the precursor nozzles of the nozzle head. This means that the nozzle head have to have suitable number of different precursor nozzles corresponding the desired nanolaminate structure. Furthermore, the conventional pulsing of the starting materials into the reaction chamber is slow as the whole reaction chamber has to be exhausted and purged between the different precursor pulses. However, when nozzle head is used, the precursors are supplied continuously from the precursor nozzles and nozzle head and the substrate are moved relative to each other. Therefore, when the coating comprises different coating layers, the supply of the precursors and the movement of the nozzle head have to be disrupted and the precursors changed so that the new coating layer may be formed using different precursors. Alternative, the different coating layers are formed in different reaction chambers or with different nozzle heads. This makes the process complicated and modifications of different coating layers in the coating difficult and complicated.

BRIEF DESCRIPTION OF THE INVENTION

An object of the present invention disclosure is thus to provide a method and an apparatus for implementing the method so as to overcome or at least alleviate the above disadvantages.

The preferred embodiments of the invention are disclosed in the dependent claims.

The invention is based on the idea of providing a method for subjecting a surface of a substrate to successive surface reactions of at least a first precursor, a second precursor and a first subsequent precursor according to the principles of atomic layer deposition for forming on the surface of the substrate a coating comprising two or more different coating layers. The method is carried out with a nozzle head comprising one or more first precursor nozzles for forming a first precursor zone and one or more second precursor nozzles for forming a second precursor zone. The method comprises:

a primary deposition step comprising subjecting the surface of the substrate to the first precursor in the first precursor zone and subjecting the surface of the substrate to the second precursor in the second precursor zone for forming a first coating layer on the surface of the substrate;
  a first changing step comprising changing the first precursor in the first precursor zone to a first subsequent precursor which is different than the first and second precursors;
  an alternate deposition step comprising subjecting the surface of the substrate to the first subsequent precursor in the first precursor zone and subjecting the surface of the substrate to the second precursor in the second precursor zone for forming a subsequent coating layer on the surface of the substrate; and transporting the substrate and simultaneously moving the nozzle head in reciprocating manner over the surface of the substrate for carrying out the primary deposition step and the alternate deposition step.

In one embodiment the method may comprise transporting the substrate in constant velocity or transporting the substrate linearly in constant velocity. The substrate may also be transported past the nozzle head, or inside a reaction chamber or through a reaction chamber, the nozzle head being arranged inside the reaction chamber. In a specific embodiment the substrate may be transported from a first roll to a second roll or from a first roll to a second roll in a reaction chamber or through the reaction chamber, the nozzle head being arranged inside the reaction chamber.

The nozzle head may be moved in reciprocating manner between a first end position and second end position, or in reciprocating manner between a first end position and second end position in relation to the substrate (12). Alternative the nozzle head may be moved in reciprocating manner along a curved or loop path, or in reciprocating manner along a curved or loop path in relation to the substrate.

The primary deposition step comprising A) forming the first coating layer on the surface of the substrate, the first changing step comprising B) replacing the first precursor in the first precursor zone to the first subsequent precursor which is different than the first and second precursors, and the alternate deposition step comprising C) forming the subsequent coating layer on the surface of the substrate.

In one embodiment of the present invention the step A) of the primary deposition step for forming of the first coating layer comprises sub-step a) subjecting the surface of the substrate to the first precursor in the first precursor zone, sub-step b) subjecting the surface of the substrate to the second precursor in the second precursor zone after sub-step a), and sub-step c) performing sub-steps a) and b) one or more times successively until the first coating layer is formed on the surface of the substrate.

In one embodiment of the present invention the step B) of the first changing step comprises replacing the first precursor in the first precursor zone to the first subsequent precursor which is different than the first and second precursors.

In one embodiment of the present invention the step C) of the alternate deposition step for forming of the subsequent coating layer comprises sub-step d) subjecting the surface of the substrate to the first subsequent precursor in the first precursor zone, sub-step e) subjecting the surface of the substrate to the second precursor in the second precursor zone after step d), and sub-step f) performing sub-steps d) and e) one or more times successively until the subsequent coating layer is formed, the subsequent coating layer being different than the first coating layer.

In another embodiment the method further comprises a second changing step comprising step D) replacing the first subsequent precursor in the first precursor zone to the first precursor.

In one embodiment the method further comprises changing the second precursor in the second precursor zone to a second subsequent precursor which is different than the first precursor, the second precursors and the first subsequent precursor and subjecting the surface of the substrate to the first subsequent precursor in the first precursor zone and subjecting the surface of the substrate to the second subsequent precursor in the second precursor zone for forming the subsequent coating layer on the surface of the substrate.

The method may comprise steps A) forming the first coating layer on the surface of the substrate, B) replacing the first precursor in the first precursor zone to the first subsequent precursor which is different than the first and second precursors and replacing the second precursor in the second precursor zone to the second subsequent precursor which is different than the first precursor, the second precursors and the first subsequent precursor, and C) forming the subsequent coating layer on the surface of the substrate.

In one embodiment the method the step A) comprises sub-steps a) subjecting the surface of the substrate to the first precursor in the first precursor zone, b) subjecting the surface of the substrate to the second precursor in the second precursor zone after sub-step a), and c) performing sub-steps a) and b) one or more times successively until the first coating layer is formed on the surface of the substrate.

In one embodiment the step B) comprises replacing the first precursor in the first precursor zone to the first subsequent precursor which is different than the first and second precursors and replacing the second precursor in the second precursor zone to the second subsequent precursor which is different than the first precursor, second precursors and the first subsequent precursor.

In one embodiment the step C) comprises sub-steps d) subjecting the surface of the substrate to the first subsequent precursor in the first precursor zone, e) subjecting the surface of the substrate to the second subsequent precursor in the second precursor zone after sub-step d), and f) performing sub-steps d) and e) one or more times successively until the subsequent coating layer is formed, the subsequent coating layer being different than the first coating layer.

In another embodiment the method further comprises step D) replacing the first subsequent precursor in the first precursor zone to the first precursor and replacing the second subsequent precursor in the second precursor zone to the second precursor.

In one embodiment the method comprises repeating step A) after step D) for forming two first coating layers, or repeating steps A), B), C) and D) one or more times for forming two or more first coating layers and two or more subsequent coating layers.

In an alternative embodiment the method comprises repeating steps B) and C) one or more times using different first or second subsequent precursors in successive repeated steps B) and C) for forming two or more different subsequent coating layers, and repeating steps B) and C) after steps A) and D), or repeating steps B) and C) one or more times using different first or second subsequent precursors in successive repeated steps B) and C) for forming two or more different subsequent coating layers, and repeating steps B) and C) successively without repeating steps A) and D) between successive repeated steps B) and C).

According to one embodiment of the invention, the method may comprise using a third precursor as the first subsequent precursor in all of the repeated steps B) and C) for forming a subsequent coating layer in step C), or using two or more different first precursors as subsequent precursor in the repeated steps B) and C) for forming two or more different subsequent coating layers in repeated steps C).

According to another embodiment of the invention, the method may comprise using a third precursor as the first subsequent precursor in all of the repeated steps B) and C) and using a fourth precursor as the second subsequent precursor in all of the repeated steps B) and C) for forming the subsequent coating layer in step C), or using two or more different precursors as the first subsequent precursor in the repeated steps B) and C) and using two or more different precursors as the second subsequent precursor in the repeated steps B) and C) for forming two or more different subsequent coating layers in repeated steps C).

The present invention is also based on the idea of providing an apparatus for subjecting a surface of a substrate to successive surface reactions of at least a first precursor, a second precursor and a first subsequent precursor according to the principles of atomic layer deposition for forming on the surface of the substrate a coating comprising two or more different coating layers. The apparatus comprises:

a nozzle head arranged to be over the surface of the substrate, the nozzle head having an output face comprising one or more first precursor nozzles and one or more second precursor nozzles;

the one or more first precursor nozzles arranged to form one or more first precursor zones and arranged to subject the surface of the substrate to the first precursor;

the one or more second precursor nozzles arranged to form one or more second precursor zones and arranged to subject the surface of the substrate to the second precursor;

at least one first precursor source for the first precursor, the at least one first precursor source being connected to the one or more first precursor nozzles and arranged to supply the first precursor to the one or more first precursor zones;

at least one second precursor source for the second precursor, the at least one second precursor source being connected to the one or more second precursor nozzles and arranged to supply the second precursor to the one or more second precursor zones;

at least one first subsequent precursor source for the first subsequent precursor, the at least one first subsequent precursor source being connected to the one or more first precursor nozzles and arranged to supply the first subsequent precursor to the one or more first precursor zones;

a transport mechanism arranged to transport the substrate; and a moving mechanism arranged to move the nozzle head in reciprocating manner over the surface of the substrate forming on the surface of the substrate a coating comprising two or more different coating layers.

In one embodiment the apparatus may further comprises at least one second subsequent precursor source for a second subsequent precursor, the at least one second subsequent precursor source being connected to the one or more second precursor nozzles and arranged to supply the second subsequent precursor to the one or more second precursor zones.

In one embodiment of the present invention the at least one first precursor source comprises a first precursor container for receiving the first precursor and a first precursor conduit arranged between the first precursor container and the one or more first precursor nozzles for supplying the first precursor from the first precursor container to the one or more first precursor zones, and the at least one second precursor source comprises a second precursor container for receiving the second precursor and a second precursor conduit arranged between the second precursor container and the one or more second precursor nozzles for supplying the second precursor from the second precursor container to the one or more second precursor zones. The at least one first subsequent precursor source further comprises a first subsequent precursor container for receiving the first subsequent precursor and a first subsequent precursor conduit arranged between the first subsequent precursor container and the one or more first precursor nozzles for supplying the first subsequent precursor from the first subsequent precursor container to the one or more first precursor zones.

In one embodiment the at least one second subsequent precursor source comprises a second subsequent precursor container for receiving the second subsequent precursor and a second subsequent precursor conduit arranged between the second subsequent precursor container and the one or more second precursor nozzles for supplying the second subsequent precursor from the second subsequent precursor container to the one or more second precursor zones.

In one embodiment of the present invention the first precursor zone comprises one or more first precursor nozzles for supplying the first precursor and the first subsequent precursor, the one or more first precursor nozzles being connected to the first precursor container via the first precursor conduit and to the first subsequent precursor container via the first subsequent precursor conduit. The second precursor zone comprises one or more second precursor nozzles or one for supplying the second precursor, the one or more second precursor nozzles being connected to the second precursor container via the second precursor conduit.

In an alternative embodiment the first precursor zone comprises one or more first precursor nozzles for supplying the first precursor and the first subsequent precursor, the one or more first precursor nozzles or the one being connected to the first precursor container via the first precursor conduit and to the first subsequent precursor container via the first subsequent precursor conduit. The second precursor zone comprises one or more second precursor nozzles for supplying the second precursor and the second subsequent precursor, the one or more second precursor nozzles being connected to the second precursor container via the second precursor conduit and to the second subsequent precursor container via the second subsequent precursor conduit.

An advantage of the method and apparatus of the present invention is that different coating layers may be formed on the surface of the substrate during the same coating process without disrupting the coating process with a nozzle head in a spatial atomic layer deposition process. Furthermore, the present invention is enables forming complex nanolaminates or coating structures in efficient manner by changing the first precursor during the coating process. This further enables creating new kind of coating having functional structures provided with different coating layers.

BRIEF DESCRIPTION OF THE DRAWINGS

In the following the invention will be described in greater detail by means of preferred embodiments with reference to the accompanying drawings, in which.

DETAILED DESCRIPTION OF THE INVENTION

Figure 1:
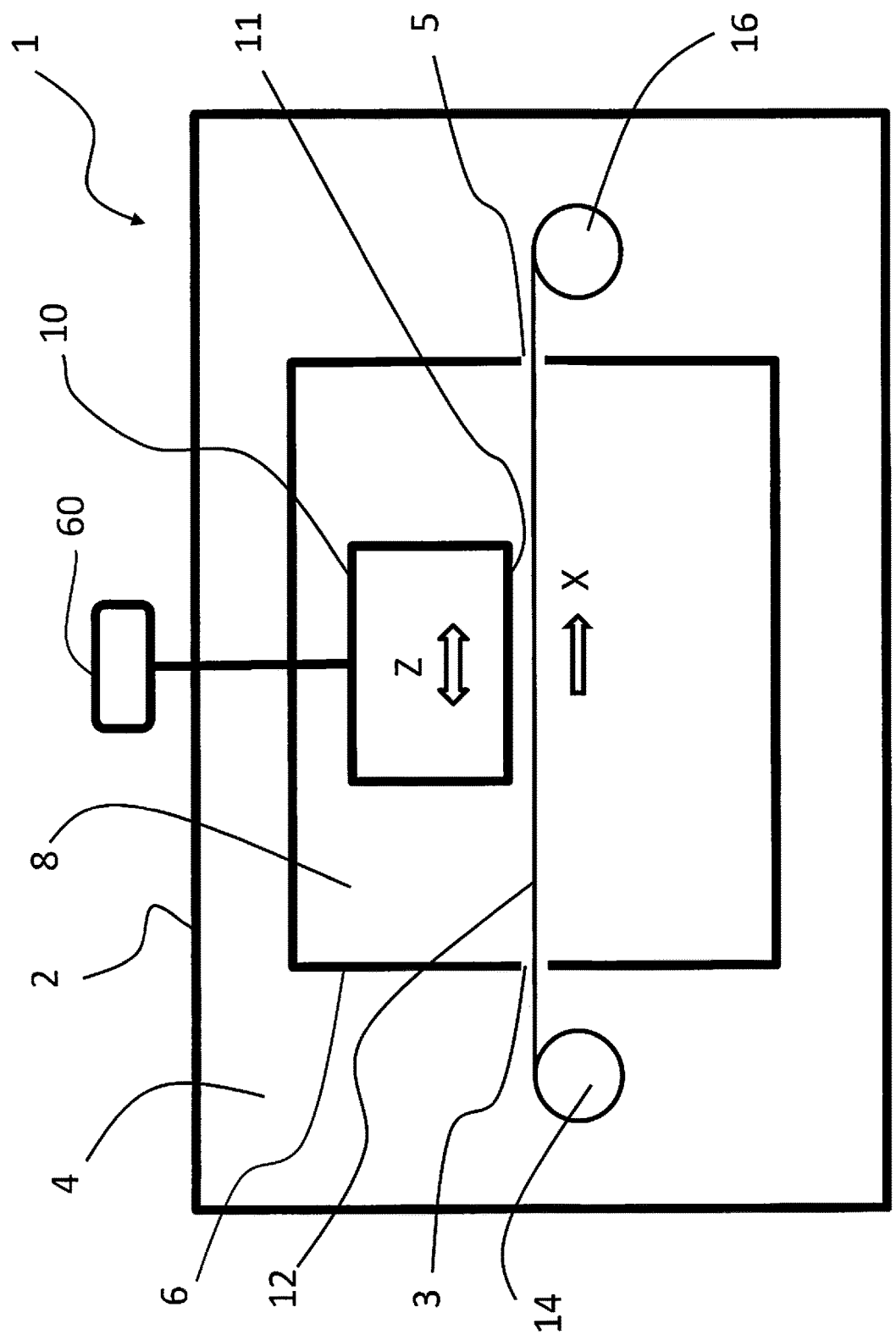
FIG. 1 shows schematically an apparatus having a reaction chamber and a nozzle head.

In the following detailed description same reference numerals denote same or corresponding features, parts or method steps in different embodiment of the present invention. For simplicity the description of these same or corresponding features, parts or method steps is not repeated in reference to every embodiment of the present invention.

In the context of this application the term "coating" means the overall coating formed on a substrate and the coating may comprise one or more coating layers. The term "coating layer" means a layer of one coating material provided on the surface of the substrate and the coating layer comprises one or more atomic layers of coating material. One atomic layer is produced by one atomic layer deposition cycle in which the surface of the substrate is subjected once to at least two different precursors.

FIG. 1 shows schematically a conventional prior art apparatus 1 for carrying out atomic layer deposition. The apparatus 1 comprises a vacuum chamber 2 defining a vacuum space 4. The apparatus may also comprise a vacuum pump (not shown) for providing vacuum or low-pressure inside the vacuum chamber 2. The apparatus 1 further comprises a reaction chamber 6 defining a reaction space 8. The reaction space 8 is preferably sealed or separated from the vacuum space 8. In some embodiments the reaction chamber 6 may be omitted and the vacuum chamber 2 forms also the reaction chamber. The reaction chamber 6 is provided with an inlet opening 3 for loading or feeding a substrate 12 into the reaction chamber 6 and with an outlet opening 5 for unloading or removing a substrate 12 from the reaction chamber 6. The inlet and outlet openings 3, 5 may be provided with gas barriers or port valves or the like for sealing the inlet and outlet openings 3, 5 such that gaseous precursor do not flow out of the reaction chamber 6. It should be noted that outlet opening 5 may be omitted and the substrate may be fed into the reaction chamber 6 and removed from the reaction chamber 6 via the same inlet opening 3.

In the apparatus 1 of FIG. 1 the substrate is a web like substrate 12 which is transported with a transport mechanism through the reaction chamber 6. The transport mechanism comprises a first roll 14 and a second roll 16, and the substrate 12 is transported from the first roll 14 to the second roll 16 in the direction X, as shown in FIG. 1. In this embodiment the first roll 14 and the second roll 16 are arranged outside the reaction chamber 6 but inside the vacuum chamber 2 for transporting the substrate 12 through the reaction chamber 6. However, in an alternative embodiment the first and second roll 14, 16 may be arranged inside the reaction chamber for transporting the substrate 12 from the first roll 14 to the second roll 16 inside the reaction chamber 6 or the first and second roll 14, 16 may be arranged even outside the vacuum chamber 2. It should be noted that the substrate 12 may also be separate piece which is loaded separate into the reaction chamber 6 or transported through the reaction chamber 6. It should be noted that the substrate 12 may be transported also from the second roll 16 to the first roll 14, and possibly two or more times between the first and second rolls 14, 16. In this embodiment the substrate 12 may be a flexible substrate 12 which may be provided to the first and second roll 14, 16.

Inside the reaction chamber 6 is provided a nozzle head 10 having output face 11. First and second precursors are supplied via the output face 11 of the nozzle head 10 to the surface of the substrate 12 for subjecting the surface of the substrate successively to the first and second precursors according to the principles of atomic layer deposition. The nozzle head 10 may be moved inside the reaction space 6 in relation to the substrate 12. In one embodiment the nozzle head is moved with a moving mechanism 60 in reciprocating manner between two end position over the surface of the substrate in direction of arrow Z as shown in FIG. 1, or in some other reciprocating manner. Preferably the nozzle head 10 is moved in reciprocating manner parallel or in the direction of the surface of the substrate 12. Therefore, the distance between the output face 11 of the nozzle head 10 and the surface of the substrate 12 may be maintained constant during the reciprocating movement of the nozzle head 12. In one embodiment of the invention the moving mechanism 60 is arranged to move the nozzle head 10 is in reciprocating manner and linearly in a plane. In another embodiment the moving mechanism 60 is arranged to move the nozzle head 10 is in reciprocating manner in a pendulum movement between a first end position and the second end position. In the latter embodiment the substrate 12 may be transported on a transport cylinder and the nozzle head 10 is moved at a constant distance over the transport cylinder and the substrate 10.

Figure 2:
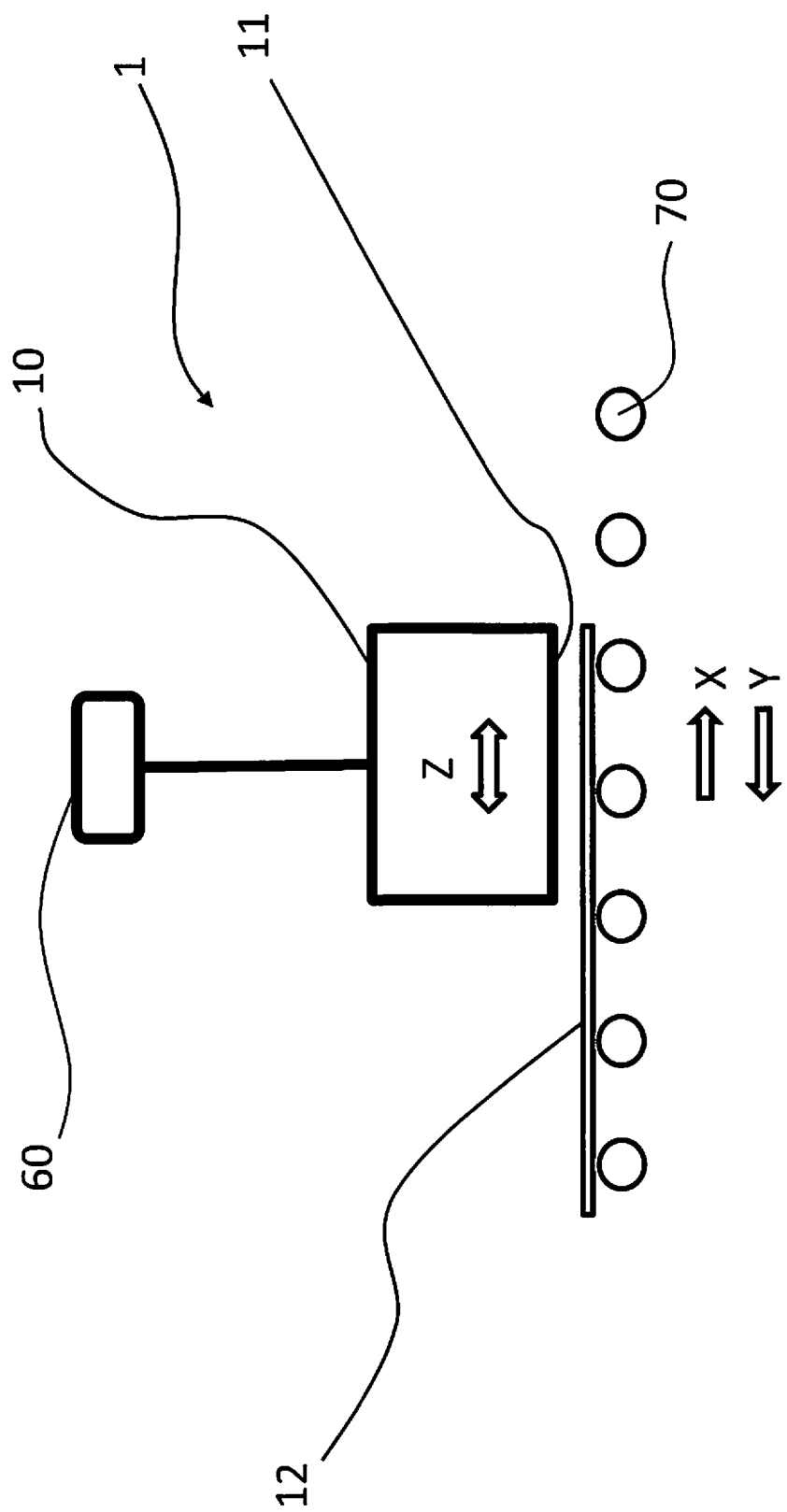
FIG. 2 shows schematically another apparatus having a reaction chamber and a nozzle head

FIG. 2 shows an alternative embodiment in which the substrate 12 is a separate piece, preferably a planar separated piece. In this embodiment the apparatus does not comprise any reaction chamber surrounding the nozzle head 10. Thus, the nozzle head 10 may be arranged to discharge precursor gases such that there is no need for the reaction chamber. The substrate 12 may be transported with a transport mechanism 70 past the nozzle head 10 such that output face 11 of the nozzle head such that the surface of the substrate 12 may be subjected to the precursors. In this embodiment the transport mechanism 70 comprises transport rolls on which the substrate 12 is transported in the direction of arrows Y in one direction or in both directions. The nozzle head 10 may be moved in similar manner with the moving mechanism 60 as in the embodiment of FIG. 1 over the surface of the substrate 12. In this embodiment the substrate 12 may be a rigid substrate 12.

It should be noted that the apparatus of FIG. 1 may be provided without the reaction chamber 6 and/or the vacuum chamber 2, and the embodiment of FIG. 2 may be provided with the reaction chamber 6 and/or the vacuum chamber 2.

It should also be noted that the transport mechanism 14, 16, 70 may be any conventional transport mechanism capable of transporting the substrate 12 past the nozzle head 10, inside the reaction chamber 6 or through the reaction chamber.

The transport mechanism 14, 16, 70 of the present invention may be arranged to transport the substrate 12 in constant velocity or linearly in constant velocity, for example in the direction X as in FIG. 1, in relation to the apparatus. The moving mechanism 60 of the nozzle head 10 may be arranged to move the nozzle head 10 in reciprocating manner between a first end position and second end position or between a first end position and second end position in relation to the substrate 12. In an alternative embodiment the moving mechanism 60 is arranged to move the nozzle head 10 in reciprocating manner along a curved path or loop path, or along a curved or loop path in relation to the substrate 12.

Figure 3:
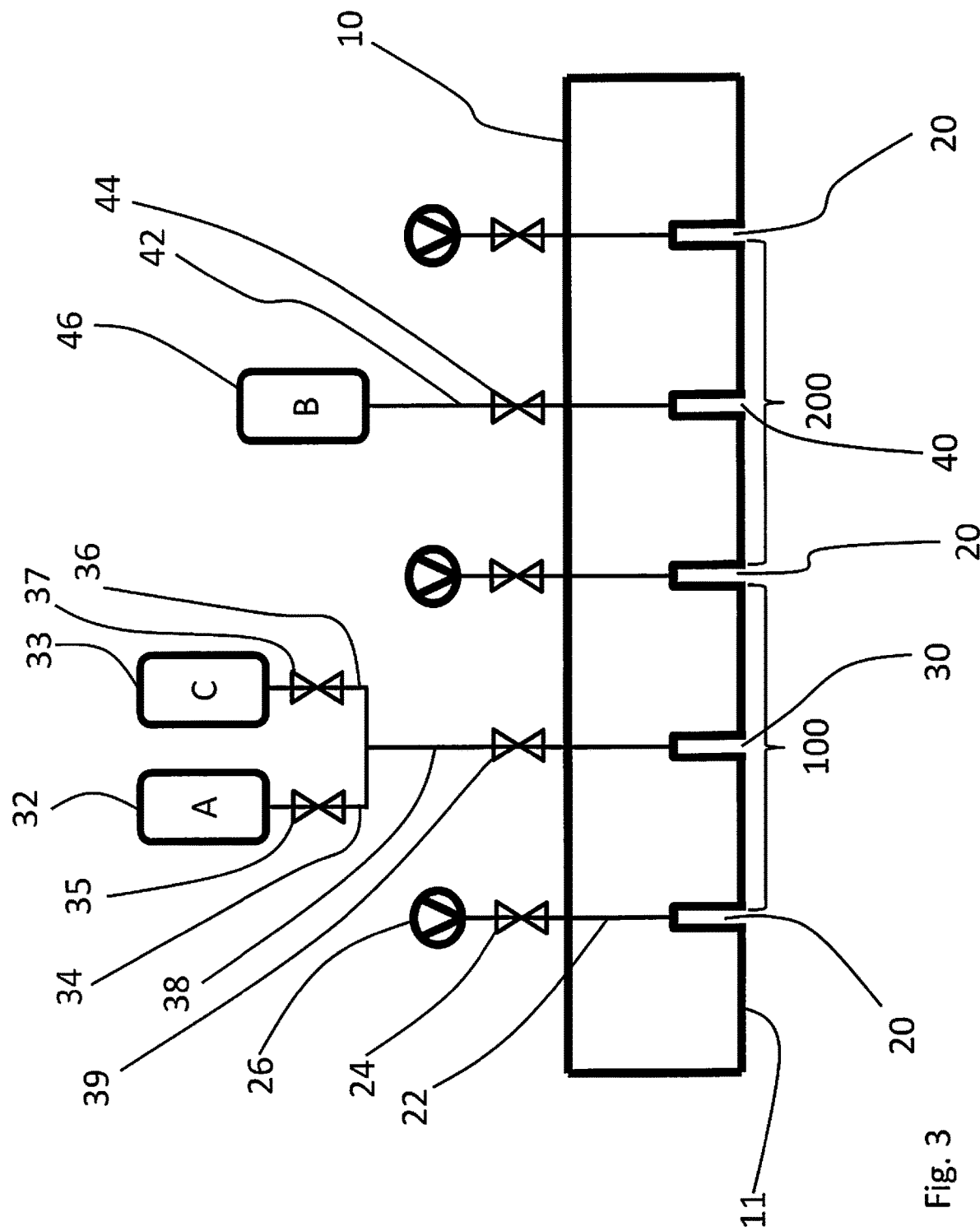
FIG. 3 shows schematically one embodiment of a nozzle head according to the present invention.

FIG. 3 shows one embodiment of the present invention and particularly one embodiment of the nozzle head 10. The output face 11 of the nozzle head 10 is provided with one or more first precursor nozzles 30 for supplying a first precursor A via the output face 11 and with one or more second precursor nozzles 40 for supplying a second precursor B via the output face 11. The output face 11 further comprises discharge channels 20 provided on both sides of the first and second precursor nozzles 30, 40 such that each first and second precursor nozzle 30, 40 is provided between two discharge channels 20.

The discharge channels 20 are connected via discharge line 22 to discharge pumps 26, or to a common discharge pump 26, for providing suction to the output face 11 for discharging precursors from the output face 11. The discharge line 22 may be provided with a discharge valve 24 for opening and closing the discharge line 22.

The one or more second precursor nozzles 40 are connected to a second precursor container 46 via a second precursor conduit 42 for supplying the second precursor B via the output face 11. The second precursor conduit 42 may be provided with a second precursor conduit valve 44 for opening and closing the second precursor line 42 for supplying and interrupting the supply of the second precursor B.

The one or more first precursor nozzles 30 are connected to a first precursor container 32 via a first precursor conduit 34 for supplying the first precursor A via the output face 11 and to a first subsequent precursor container 33 via the first subsequent precursor conduit 36 supplying a first subsequent precursor C via the output face 11. The first precursor conduit 34 may be provided with a first precursor conduit valve 35 and the subsequent precursor conduit 36 may be provided with a first subsequent precursor conduit valve 37 for opening and closing the first precursor conduit 34 and the first subsequent precursor conduit 37, respectively, for supplying and interrupting the supply of the first precursor A and the first subsequent precursor C. The apparatus further comprises a first zone supply conduit 38 connected to both the first precursor conduit 34 and the first subsequent precursor conduit 36 and to the one or more first precursor nozzle 30 for supplying the first precursor A and the first subsequent precursor C via the common first zone supply conduit 38 to the first precursor nozzle 30. The first zone supply conduit 38 may also be provided with a first zone supply conduit valve 39 for opening and closing the first zone supply conduit 38 and the supply of the first precursor A and the first subsequent precursor C.

The first precursor nozzle 30 is provided between the discharge channels 20 on the output face 11. When the first precursor A or the first subsequent precursor C are supplied from the first precursor nozzle 30 they flow from the first precursor nozzle 30 via the output face 11 to the discharge channels 20 and thus the surface of the substrate 12 is subjected to the first precursor A or the first subsequent precursor C between the discharge channels. A first precursor zone 100 is therefore formed between the discharge channels 20, as shown in FIG. 3. Similarly, the second precursor nozzle 40 is provided between the discharge channels 20 on the output face 11. When the second precursor B is supplied from the second precursor nozzle 40 it flows from the second precursor nozzle 40 via the output face 11 to the discharge channels 20 and thus the surface of the substrate 12 is subjected to the second precursor B between the discharge channels. A first precursor zone 200 is therefore formed between the discharge channels 20, as shown in FIG. 3.

In the embodiment of FIG. 3, the output face 11 comprises in the following order: a discharge channel 20, a first precursor nozzle 30, a discharge channel 20 and a second precursor nozzle 40. Furthermore, the output face 11 comprises in the flowing order: a first precursor zone 100 and a second precursor zone 200. These mentioned orders may be repeated one or more times. Thus when the nozzle head 10 and the substrate 12 are moved in relation to each other the surface of the substrate 12 is successively and alternatingly subjected to the first precursor zone 100 and the second precursor zone 200.

As shown in FIG. 3, the first precursor container 32 is connected to the first precursor nozzle 30 and to the first precursor zone 100 via the first precursor conduit 34 and the first zone supply conduit 38 and the first subsequent precursor container 33 is also connected to the first precursor nozzle 30 and to the first precursor zone 100 via the first subsequent precursor conduit 36 and the first zone supply conduit 38. Thus both the first precursor source 32 and the first subsequent precursor source 33 are both connected to the first precursor nozzle 30 and the first precursor zone 100 such that both the first precursor A and the first subsequent precursor B may be supplied via the first precursor nozzle 30 and the first precursor zone 100. This enables changing the first precursor A to the first subsequent precursor C during the coating process such that different coating layers may be formed on the surface of the substrate 12. Accordingly, a first coating layer may be formed using first and second precursors A, B and a subsequent coating layer using subsequent precursor C and precursor B.

It should be noted that the apparatus may comprise one or more different first subsequent precursor containers or sources connected to the first precursor nozzle 30 and to the first precursor zone 100 in similar manner as the first subsequent precursor container 33 or the first subsequent precursor source of FIG. 3. Each of these different first subsequent precursor containers or precursor sources may comprise different first subsequent precursors.

Figure 4:
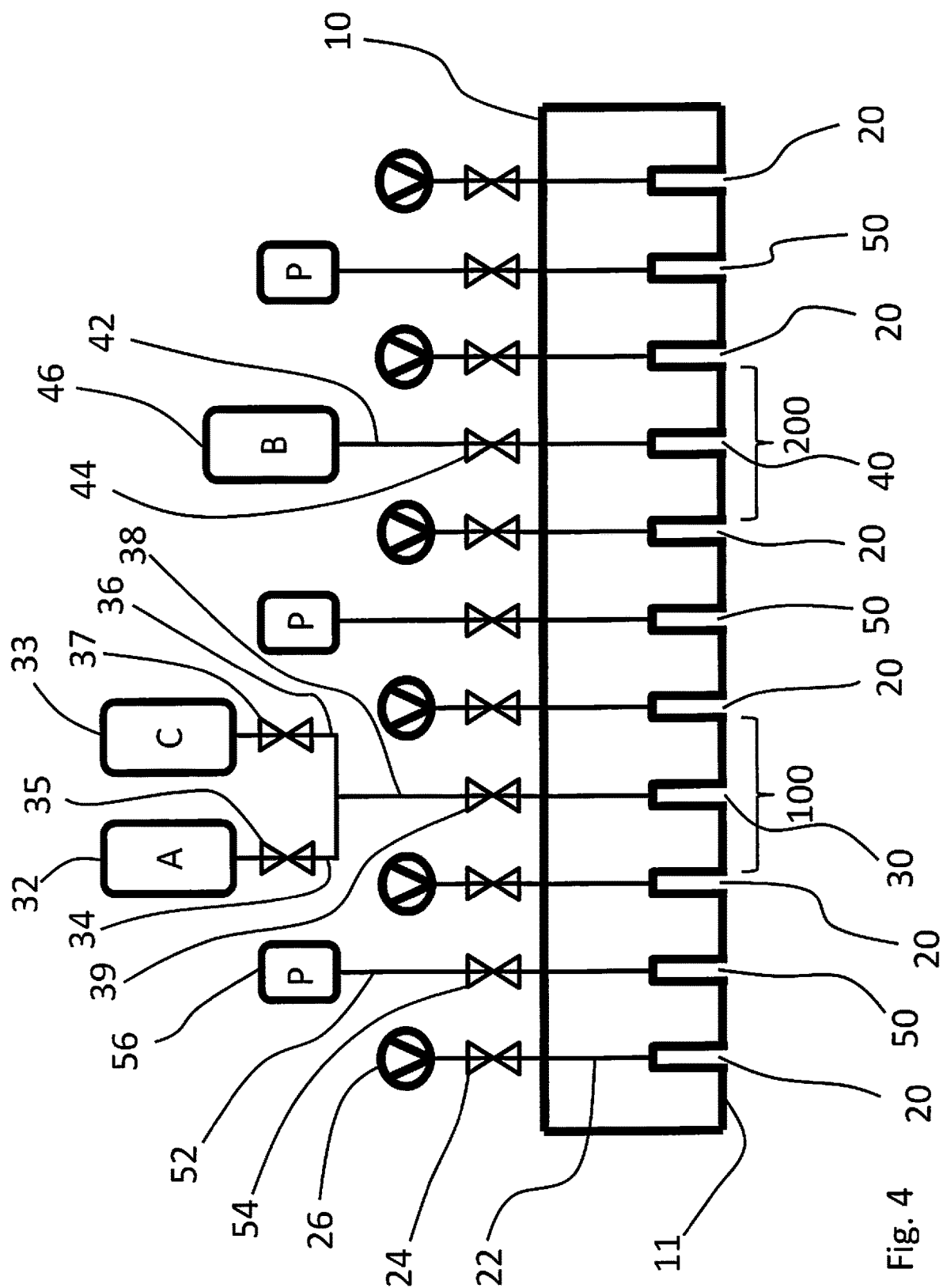
FIG. 4 shows schematically another embodiment of a nozzle head according to the present invention.

FIG. 4 shows an alternative embodiment of the nozzle head 10 according to the present invention, the nozzle head of FIG. 4 being a modification of the nozzle head 10 of FIG. 3. The embodiment of FIG. 4 comprises purge gas nozzles 50 provided to the output face 11 of the nozzle head 10. One purge gas nozzle 50 may be provided between the first and second precursor nozzles 30, 40 or between the first and second precursor zone 100, 200 for separating the first and second precursor zone 100, 200 from each other. Purge gas nozzles 50 may also be provided between end of the output face 11 and the first or second precursor zone 100, 200.

In the embodiment of FIG. 4, the output face 11 comprises in the following order: a discharge channel 20, a purge gas channel 50, a discharge channel 20, a first precursor nozzle 30, a discharge channel 20, a purge gas channel 50, a discharge channel 50 and a second precursor nozzle 40. Furthermore, the output face 11 comprises in the flowing order: a discharge channel 20, a purge gas channel 50, a discharge channel 20, a first precursor zone 100, a discharge channel 20, a purge gas channel 50, a discharge channel 50 and a second precursor zone 200. These mentioned orders may be repeated one or more times.

The apparatus may further comprise a purge gas container 56 which is connected to the purge gas nozzle 50 via a purge gas line 52 for supplying purge gas P via the output face 11. The purge gas line 52 may also be provided with a purge gas valve 54 for opening and closing the purge gas line 52 and the supply of the purge gas P.

Figure 5:
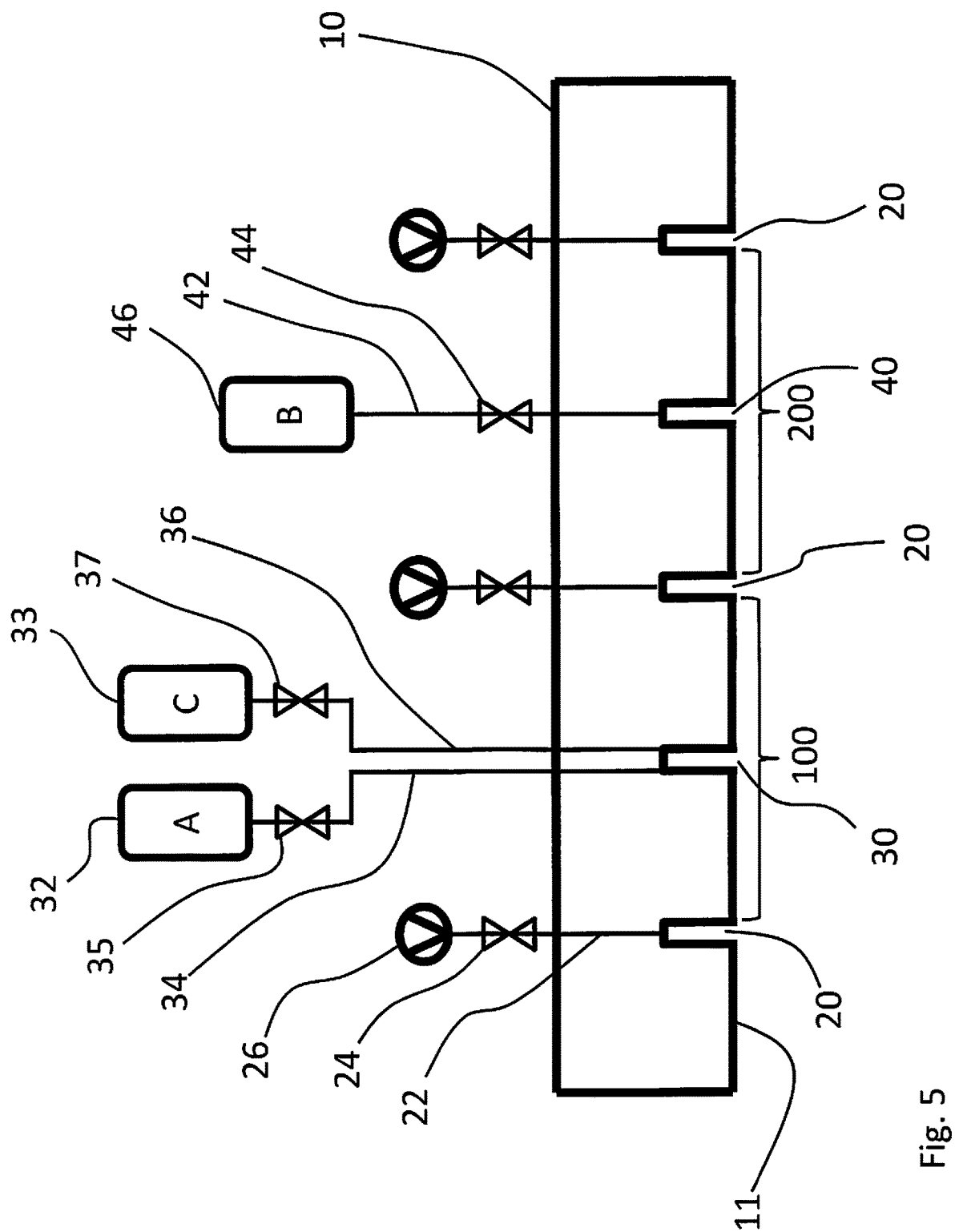
FIG. 5 shows schematically yet another embodiment of a nozzle head according to the present invention.

FIG. 5 shows an alternative embodiment of the nozzle head 10 according to the present invention, the nozzle head of FIG. 5 being a modification of the nozzle head 10 of FIG. 3. In this embodiment there is no first zone supply conduit

38. In this embodiment the first precursor conduit 34 and the first subsequent precursor conduit 36 are connected to the first zone precursor nozzle 30 as separate conduits. This means that the first precursor conduit 34 extends directly between the first precursor container 32 and the first precursor nozzle 30, and the first subsequent precursor conduit 36 extends directly between the first subsequent precursor container 33 and the first precursor nozzle 30. Other features and structures of the embodiment of FIG. 5 correspond the features and structures of FIG. 3.

Figure 6:
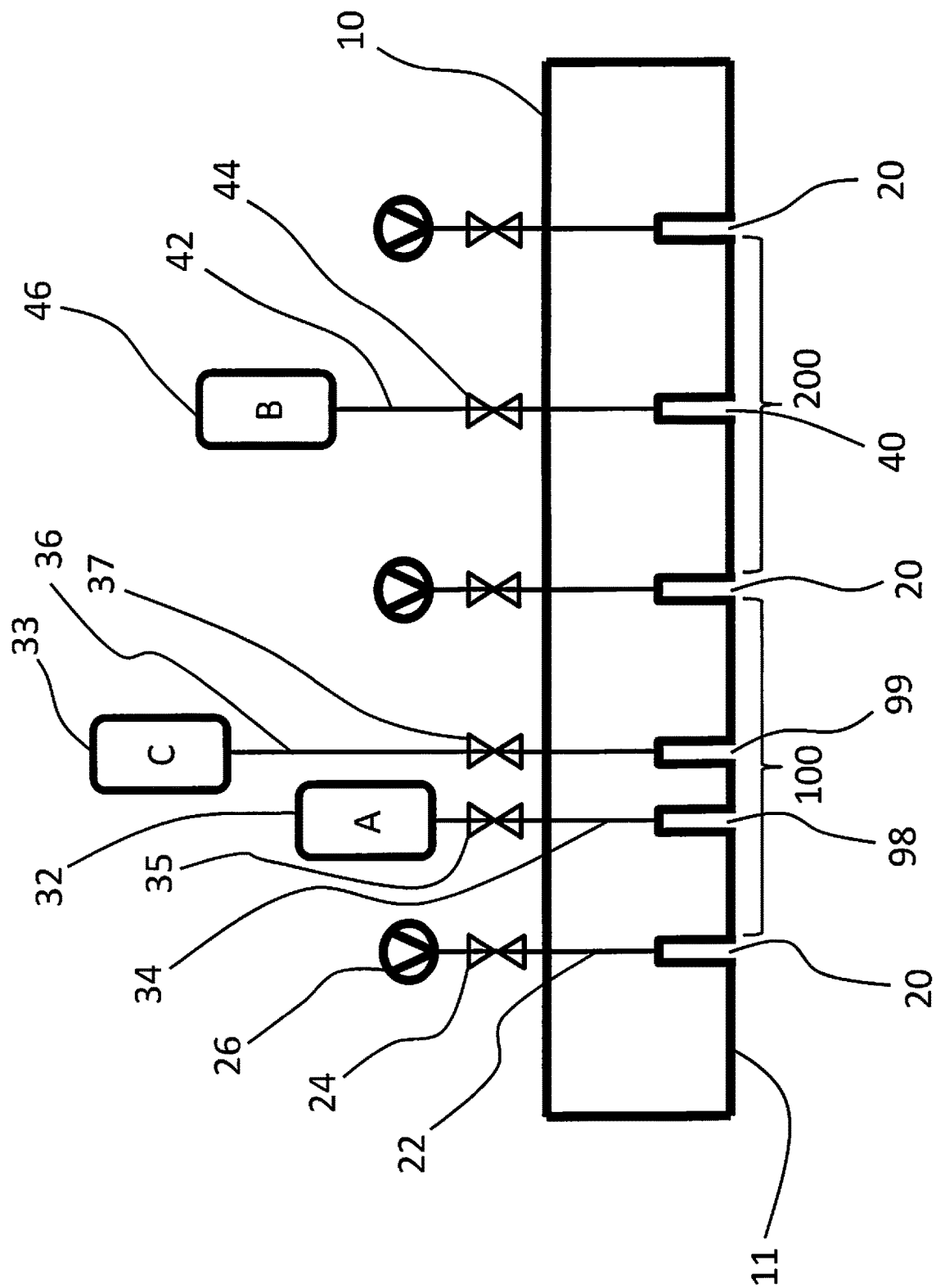
FIG. 6 shows schematically still another embodiment of a nozzle head according to the present invention.

FIG. 6 shows an alternative embodiment of the nozzle head 10 according to the present invention, the nozzle head of FIG. 6 being a modification of the nozzle head 10 of FIG. 3. In the embodiment of FIG. 6 the output face 11 comprises one or more first precursor nozzles 98 for supplying the first precursor A and one or more first subsequent precursor nozzles 99 for supplying the first subsequent precursor C via the output face 11. Accordingly, the first precursor zone 100 is provided with separate nozzles 98, 99 for the first precursor A and the first subsequent precursor C. Therefore, the first precursor nozzle 98 is connected directly to the first precursor container 32 via the first precursor conduit 34 and the first subsequent precursor nozzle 99 is connected directly to the first subsequent precursor container 33 via the first subsequent precursor conduit 36. Therefore, the first precursor A and the first subsequent precursor C may be supplied separately from each other to the first precursor zone 100. Other features and structures of the embodiment of FIG. 6 correspond the features and structures of FIG. 3.

In the following is described an alternative type of apparatus 1 for implementing the present invention. The apparatus described in connection with FIGS. 6 to 10 does not disclose a nozzle head 10, but main features of the invention are same in the apparatuses of FIGS. 3 to 6.

Figure 7:
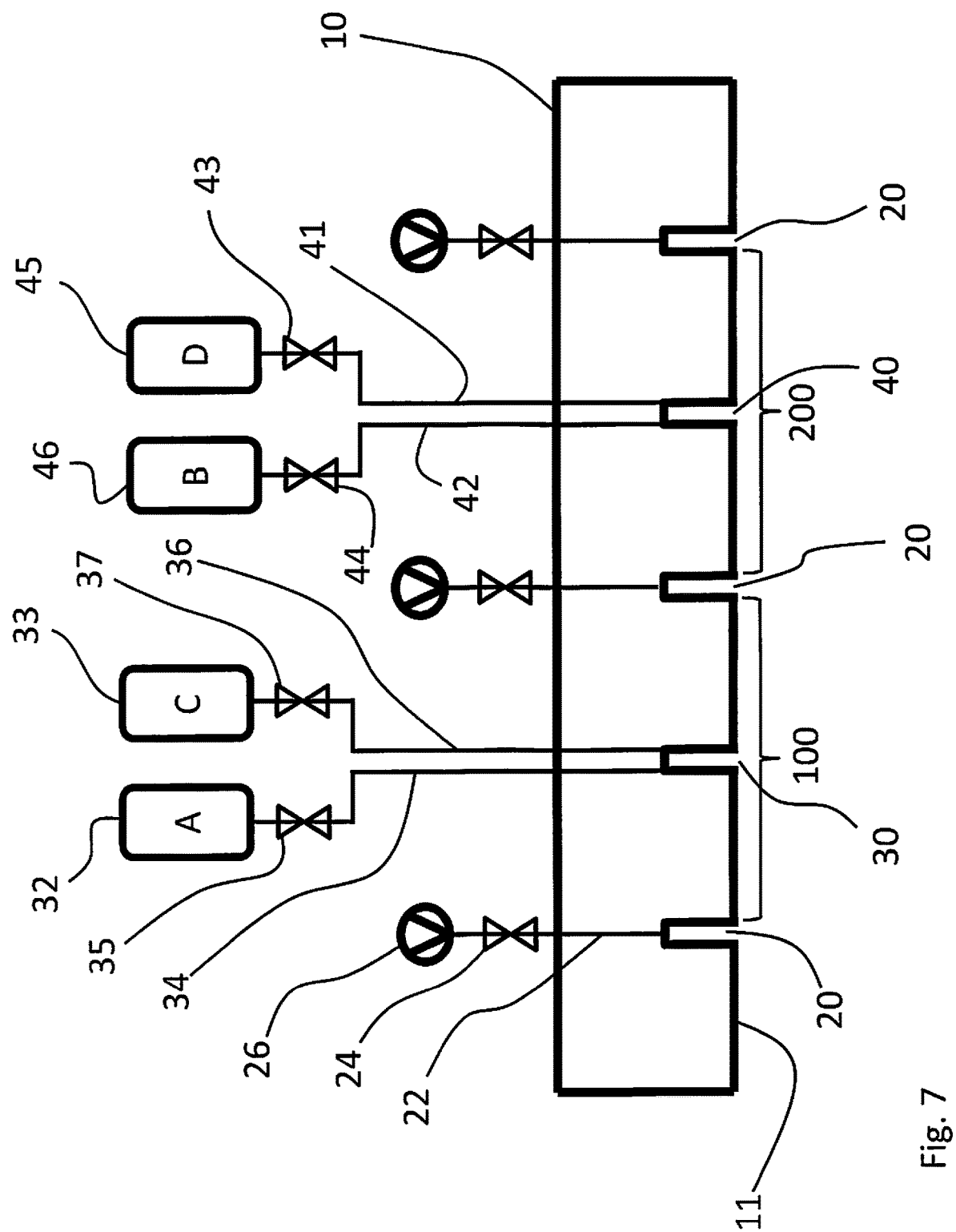
FIG. 7 shows schematically still another embodiment of a nozzle head according to the present invention.

FIG. 7 shows an alternative embodiment of the nozzle head 10 according to the present invention, the nozzle head of FIG. 6 being a modification of the nozzle head 10 of FIGS. 3 and 5. In this embodiment also the second precursor B may be replaced with a second subsequent precursor D. Therefore, the apparatus of FIG. 6 comprises at least one second subsequent precursor source 45 for a second subsequent precursor D. The at least one second subsequent precursor source 45 is connected to the one or more second precursor zones 200 and arranged to supply the second subsequent precursor D to the one or more second precursor zones 200. The at least one second subsequent precursor source comprises a second subsequent precursor container 45 for receiving the second subsequent precursor D and a second subsequent precursor conduit 41 arranged between the second subsequent precursor container 45 and the one or more second precursor zones 200 for supplying the second subsequent precursor D from the second subsequent precursor container 45 to the one or more second precursor zones 200. The second precursor zone 200 comprises one or more second zone precursor nozzles 40 for supplying the second precursor B and the second subsequent precursor D, the one or more second zone precursor nozzles 40 being connected to the second precursor container 46 via the second precursor conduit 42 and to the second subsequent precursor container 45 via the second subsequent precursor conduit 41.

In the embodiment of FIG. 7, the second precursor conduit 42 and the second subsequent precursor conduit 41 are connected to the one or more second zone precursor nozzles 40 as separate conduits.

In an alternative embodiment, as in FIG. 3, the apparatus may further comprise a second zone supply conduit connected to both the second precursor conduit 42 and the second subsequent precursor conduit 41 and to the one or more second zone precursor nozzles 40 for supplying the second precursor B and the second subsequent precursor D via the common second zone supply conduit.

In a yet alternative embodiment the second precursor zone 200 may comprise one or more second precursor nozzles for supplying the second precursor B and one or more second subsequent precursor nozzles for supplying the second subsequent precursor D. The one or more second precursor nozzles are connected to the second precursor container 46 via the second precursor conduit 42 and the one or more second subsequent precursor nozzles being connected to the second subsequent precursor container 45 via the second subsequent precursor conduit 41.

According to the above mentioned, the supply of the second subsequent precursor may be provided in the same manner as the first subsequent precursor.

According to the above description in relation to different embodiments, the present invention provides an apparatus comprising:

one or more first precursor zones 100 arranged to subjected the surface of the substrate 12 to the first precursor A and one or more second precursor zones 200 arranged to subject the surface of the substrate 12 to the second precursor B;

at least one first precursor source 32, 34 for the first precursor A, the at least one first precursor source 32, 34 is connected to the one or more first precursor zones 100 and arranged to supply the first precursor A to the one or more first precursor zones 100 and at least one second precursor source 42, 46 for the second precursor B, the at least one second precursor source 42, 46 being connected to the one or more second precursor zones 200 and arranged to supplying the second precursor B to the one or more second precursor zones 200.

According to the present invention the apparatus further comprises at least one first subsequent precursor source 33, 36 for the first subsequent precursor C, the at least one first subsequent precursor source 33, 36 being connected to the one or more first precursor zones 100 and arranged to supply the first subsequent precursor C to the one or more first precursor zones 100. Therefore, the apparatus of the present invention enables changing the precursor in the first precursor zone 100 during the coating process. It should be noted that the apparatus may comprise several first coating zones 100, and the changing of the precursor in the first precursor zone 100 may be carried out separately in individual first precursor zones 100, in groups of first precursor zones 100 or in all the first precursor zones 100 at the same time.

The apparatus may further comprise at least one second subsequent precursor source 45, 41 for the second subsequent precursor D, the at least one second subsequent precursor source 45, 41 is connected to the one or more second precursor zones 200 and arranged to supply the second subsequent precursor D to the one or more second precursor zones 200. Therefore, the apparatus of the present invention enables changing the precursor in the second precursor zone 200 during the coating process. It should be noted that the apparatus may comprise several second coating zones 200, and the changing of the precursor in the second precursor zone 200 may be carried out separately in individual second precursor zones 200, in groups of second precursor zones 200 or in all the second precursor zones 200 at the same time.

The present invention provides further a method for subjecting a surface of a substrate 12 to successive surface reactions of at least a first precursor A, a second precursor B and a subsequent precursor C according to the principles of atomic layer deposition for forming on the surface of the substrate 12 a coating comprising two or more different coating layers. The method may be implemented with an apparatus as described above.

The method comprises:

a primary deposition step comprising subjecting the surface of the substrate 12 to the first precursor A in a first precursor zone 100 and subjecting the surface of the substrate 12 to the second precursor B in a second precursor zone 200 for forming a first coating layer 302 on the surface of the substrate 12, a first changing step comprising changing the first precursor A in the first precursor zone 100 to a subsequent precursor C which is different than the first and second precursors A, B, an alternate deposition step comprising subjecting the surface of the substrate 12 to the subsequent precursor C in the first precursor zone 100 and subjecting the surface of the substrate 12 to the second precursor B in the second precursor zone 200 for forming a subsequent coating layer on the surface of the substrate 12, and transporting the substrate 12 and simultaneously moving the nozzle head 10 in reciprocating manner over the surface of the substrate 12 for carrying out the primary deposition step and the alternate deposition step.

According to the above mentioned the primary deposition step comprises steps:

A) forming the first coating layer on the surface of the substrate 12, the forming of the first coating layer comprising sub-steps:
 a) subjecting the surface of the substrate 12 to the first precursor A in the first precursor zone 100;
 b) subjecting the surface of the substrate 12 to the second precursor B in the second precursor zone 200 after sub-step a); and
 c) performing sub-steps a) and b) one or more times successively until the first coating layer is formed on the surface of the substrate 12.

The first changing step further comprises:

B) replacing the first precursor A in the first precursor zone 100 to the subsequent precursor C which is different than the first and second precursors A, B, and the alternate deposition step comprises:

C) forming the subsequent coating layer on the surface of the substrate 12, the forming of the subsequent coating layer comprising sub-steps:
 d) subjecting the surface of the substrate 12 to the subsequent precursor (C) in the first precursor zone 100;
 e) subjecting the surface of the substrate 12 to the second precursor B in the second precursor zone 200 after sub-step d); and
 f) performing sub-steps d) and e) one or more times successively until the subsequent coating layer is formed, the subsequent coating layer being different than the first coating layer.

The method may further comprises a second changing step comprising step D) replacing the subsequent precursor C in the first precursor zone 100 to the first precursor A.

The method may further comprise changing the second precursor B in the second precursor zone 200 to a second subsequent precursor D which is different than the first precursor A, the second precursor B and the first subsequent precursor C, and subjecting the surface of the substrate 12 to the first subsequent precursor C in the first precursor zone 100 and subjecting the surface of the substrate 12 to the second subsequent precursor D in the second precursor zone 200 for forming a subsequent coating layer on the surface of the substrate 12. Thus the first and second precursors A, B may both be replaced with the first and second subsequent precursors C, D, respectively, at the same time or at different times separately.

Accordingly, the method may comprise steps:

A) forming the first coating layer on the surface of the substrate 12, the forming of the first coating layer comprising sub-steps:
 a) subjecting the surface of the substrate 12 to the first precursor A in the first precursor zone 100;
 b) subjecting the surface of the substrate 12 to the second precursor B in the second precursor zone 200 after sub-step a); and
 c) performing sub-steps a) and b) one or more times successively until the first coating layer is formed on the surface of the substrate 12, The method further comprises:

B) replacing the first precursor A in the first precursor zone 100 to the first subsequent precursor C which is different than the first and second precursors A, B and replacing the second precursor B in the second precursor zone 200 to the second subsequent precursor D which is different than the first precursor, second precursors and the first subsequent precursor A, B, C; and C) forming the subsequent coating layer on the surface of the substrate 12, the forming of the subsequent coating layer comprising sub-steps:
 d) subjecting the surface of the substrate 12 to the first subsequent precursor C in the first precursor zone 100;
 e) subjecting the surface of the substrate 12 to the second subsequent precursor D in the second precursor zone 200 after sub-step d); and
 f) performing sub-steps d) and e) one or more times successively until the subsequent coating layer is formed, the subsequent coating layer being different than the first coating layer.

The method may further comprise step D) replacing the first subsequent precursor C in the first precursor zone 100 to the first precursor A and replacing the second subsequent precursor D in the second precursor zone 200 to the second precursor B.

When the coating is provided on the surface of the substrate the method may comprise repeating step A) after step D) for forming two first coating layers and only subsequent coating layer, or it may comprise repeating steps A), B), C) and D) one or more times for forming two or more first coating layers and two or more subsequent coating layers.

In an alternative embodiment the method may comprise repeating steps B) and C) one or more times using different first and/or second subsequent precursors in successive repeated steps B) and C) for forming two or more different subsequent coating layers, and repeating steps B) and C) after steps A) and D). In a yet alternative embodiment the method may comprise repeating steps B) and C) one or more times using different first and/or second subsequent precursors in successive repeated steps B) and C) for forming two or more different subsequent coating layers, and repeating steps B) and C) successively without repeating steps A) and D) between successive repeated steps B) and C). According to the above mentioned a predetermined third precursor C may be used as the first subsequent precursor in all of the repeated steps B) and C) for forming a subsequent coating layer in step C) and in all the repeated step C). Alternative two or more different precursors may be used as the first subsequent precursor in the repeated steps B) and C) for forming two or more different subsequent coating layers in repeated steps C).

In a yet alternative embodiment a predetermined third precursor C may be used as the first subsequent precursor in all of the repeated steps B) and C) and a predetermined fourth precursor D may be used as the second subsequent precursor in all of the repeated steps B) and C) for forming a subsequent coating layer (304) in step C). In alternative embodiment two or more different precursors may be used as the first subsequent precursor C in the repeated steps B) and C) and/or two or more different precursors may be used as the second subsequent precursor D in the repeated steps B) and C) for forming two or more different subsequent coating layers in repeated steps C).

Figure 8A:
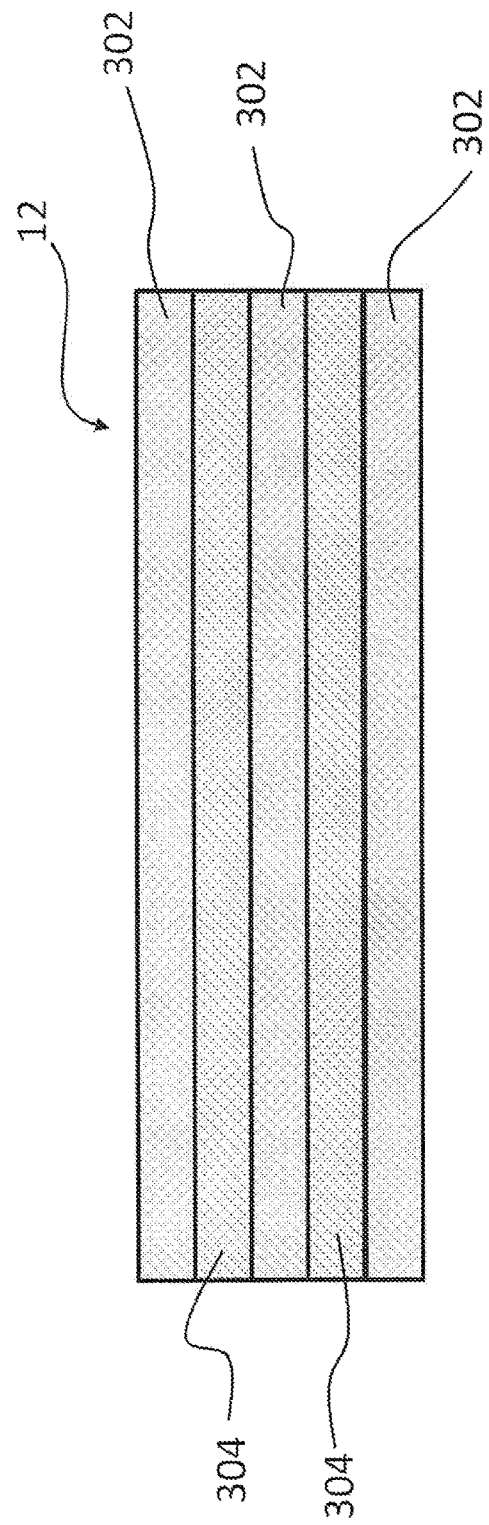
FIGS. 8A and 8B show schematically coatings and coating layers formed with a method and apparatus according to the present invention.

FIG. 8A shows a coating of a substrate 12 provided according to the present invention. The first coating layer 302 is provided in steps A) first with the first and second precursors A, B. Then a subsequent coating layer 304 is formed according to steps B) and C) with first subsequent precursor C and the second precursor B, or with first subsequent precursor C and second subsequent precursor D. After forming the subsequent coating layer 304 the step D) is carried out and step A) repeated. Then steps B), C), D) and A) are all repeated still once for forming three first coating layers 302 and two subsequent coating layers 304.

Figure 8B:
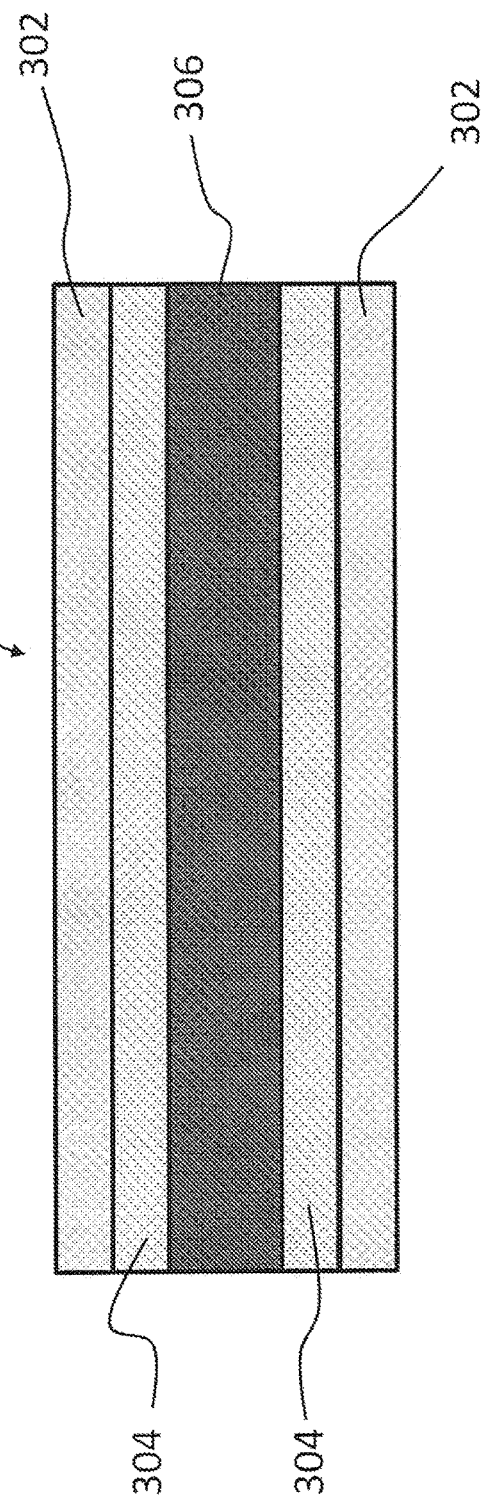

FIG. 8B shows an alternative embodiment in which the first coating layer 302 is provided in steps A) first with the first and second precursors A, B. Then a subsequent coating layer 304 is formed according to steps B) and C) with a first subsequent precursor and the second precursor B. After that a subsequent coating layer 306 is formed according to steps B) and C) with the first subsequent precursor C and the second subsequent precursor. Then the subsequent coating layer 304 is provided again with the first subsequent precursor C and the second precursor B in repeated steps B) and C). And finally, the step D) is carried out and step A) repeated for providing the first coating layer 302 again.

As can be seen, the subsequent coating layer 306 has different thickness than the other coating layers 302, 304. The thickness of the coating layer depends how many times the steps a), b) and e) and f) are repeated in steps A) and C), respectively.

In the method the step A) may be carried out by supplying the first precursor A to the first coating zone 100 for subjecting the surface of the substrate 12 to the first precursor A in the first precursor zone 100 and by supplying the second precursor B to the second precursor zone 200 for subjecting the surface of the substrate 12 to the second precursor B in the second precursor zone 86, 200. The step C) may be carried out by supplying the first subsequent precursor C to the first coating zone 100 for subjecting the surface of the substrate 12 to the first subsequent precursor C in the first precursor zone 100 and by supplying the second precursor B to the second precursor zone 200 for subjecting the surface of the substrate 12 to the second precursor B in the second precursor zone 200.

In the present invention it should be noted that always the first precursor A and the second precursor B are supplied continuously to the first precursor zone 100 and the second precursor zone 200, respectively, in step A), and the first subsequent precursor C and the second precursor B or the second subsequent precursor D are supplied continuously to the first precursor zone 100 and the second precursor zone 200, respectively, in step C). Therefore, the present invention does not comprise pulsing the precursors as in the conventional ALD-process in a reaction chamber. In the present invention the precursors are fed continuously in each step and sub-step until the first precursor A is replaced by the first subsequent precursor C and/or the second precursor B with the second subsequent precursor D, or vice versa.

In one embodiment the first precursor A is trimethylaluminium $Al_2(Ch_3)_6$ (TMA) and the second precursor is water $H_2O$. Thus, the formed first coating layer is aluminium oxide layer $Al_2O_3$. In this embodiment the first subsequent precursor C is titanium tetrachloride $TiCl_4$. The formed subsequent coating layer is titanium dioxide layer $TiO_2$. Therefore, in this embodiment the metal precursor is changed and replaced, meaning that only the first precursor is changed to the first subsequent precursor.

In an alternative embodiment the first precursor A is trimethylaluminium $Al_2(Ch_3)_6$ (TMA) and the second precursor is water $H_2O$. Thus, the formed first coating layer is aluminium oxide layer $Al_2O_3$. In this embodiment the first subsequent precursor C is diethyl zinc $(C_2H_5)_2Zn$ (DEZ). The formed subsequent coating layer is zinc oxide layer ZnO. Therefore, also in this embodiment the metal precursor is changed and replaced, meaning that only the first precursor is changed to the first subsequent precursor.

In a yet alternative embodiment the first precursor A is dihydrogen monosulfide $H_2S$ and the second precursor B is diethyl zinc $(C_2H_5)_2Zn$ (DEZ). Thus, the formed first coating layer is zinc sulphide layer ZnS. In this embodiment the first subsequent precursor C is water $H_2O$. Thus, formed the subsequent coating layer zinc oxide layer ZnO. Therefore, in this embodiment the non-metal precursor is changed and replaced, meaning that only the first precursor is changed to the first subsequent precursor.

In another embodiment both the first precursor A and the second precursor B are replaced. In this embodiment the first precursor A is trimethylaluminium $Al_2(Ch_3)_6$ (TMA) and the second precursor is water $H_2O$. The formed first coating layer is aluminium oxide layer $Al_2O_3$. The first subsequent precursor C is diethyl zinc $(C_2H_5)_2Zn$ (DEZ) and the second subsequent precursor D is dihydrogen monosulfide $H_2S$. Therefore, the formed subsequent coating layer is zinc sulphide layer ZnS. Accordingly, in this embodiment both the first and second precursors A, B are replaced and thus the metal precursor and the non-metal precursor are replaced and changed.

It should be noted, that according to the present invention one of the first and second precursors may be replaced or alternative both the first and second precursors may be replaced. The replaced precursor may be the metal precursor or the non-metal precursor or the metal precursor and the non-metal precursor.

It will be obvious to a person skilled in the art that, as the technology advances, the inventive concept can be implemented in various ways. The invention and its embodiments are not limited to the examples described above but may vary within the scope of the claims.

The invention claimed is:

1. A method for subjecting a surface of a substrate to successive surface reactions of at least a first precursor, a second precursor and a first subsequent precursor according to the principles of atomic layer deposition for forming on the surface of the substrate a coating comprising two or more different coating layers, the method being carried out with a nozzle head comprising one or more first precursor nozzles for forming a first precursor zone and one or more second precursor nozzles for forming a second precursor zone, wherein the method comprises:

a primary deposition step comprising subjecting the surface of the substrate to the first precursor in the first precursor zone and subjecting the surface of the substrate to the second precursor in the second precursor zone for forming a first coating layer on the surface of the substrate;

a first changing step comprising changing the first precursor in the first precursor zone to a first subsequent precursor which is different than the first and second precursors;

an alternate deposition step comprising subjecting the surface of the substrate to the first subsequent precursor in the first precursor zone and subjecting the surface of the substrate to the second precursor in the second precursor zone for forming a subsequent coating layer on the surface of the substrate; and transporting the substrate and simultaneously moving the nozzle head in a reciprocating manner over the surface of the substrate for carrying out the primary deposition step and the alternate deposition step.

2. The method according to claim 1, wherein the method further comprises one of:
transporting the substrate in constant velocity; or
transporting the substrate linearly in constant velocity.

3. The method according to claim 2, wherein the method further comprises one of:
transporting the substrate past the nozzle head; or
transporting the substrate inside a reaction chamber, the nozzle head being arranged inside the reaction chamber; or
transporting the substrate through a reaction chamber, the nozzle head being arranged inside the reaction chamber.

4. The method according to claim 1, wherein the method further comprises one of:
transporting the substrate past the nozzle head; or
transporting the substrate inside a reaction chamber, the nozzle head being arranged inside the reaction chamber; or
transporting the substrate through a reaction chamber, the nozzle head being arranged inside the reaction chamber.

5. The method according to claim 1, wherein the method further comprises one of:
transporting the substrate from a first roll to a second roll; or
transporting the substrate from a first roll to a second roll in a reaction chamber or through the reaction chamber, the nozzle head being arranged inside the reaction chamber.

6. The method according to claim 1, wherein the method further comprises one of:
moving the nozzle head in a reciprocating manner between a first end position and a second end position; or
moving the nozzle head in a reciprocating manner between a first end position and a second end position in relation to the substrate; or
moving the nozzle head in a reciprocating manner along a curved or loop path; or
moving the nozzle head in a reciprocating manner along a curved or loop path in relation to the substrate.

7. The method according to claim 1, wherein the primary deposition step comprises:
A) forming the first coating layer on the surface of the substrate, the forming of the first coating layer comprising sub-steps:
a) subjecting the surface of the substrate to the first precursor in the first precursor zone;
b) subjecting the surface of the substrate to the second precursor in the second precursor zone after sub-step a); and
performing sub-steps a) and b) one or more times successively until the first coating layer is formed on the surface of the substrate,
the first changing step comprising:
B) replacing the first precursor in the first precursor zone to the first subsequent precursor which is different than the first and second precursors, and
the alternate deposition step comprising:
C) forming the subsequent coating layer on the surface of the substrate, the forming of the subsequent coating layer comprising sub-steps:
d) subjecting the surface of the substrate to the first subsequent precursor in the first precursor zone;
e) subjecting the surface of the substrate to the second precursor in the second precursor zone after sub-step d); and
f) performing sub-steps d) and e) one or more times successively until the subsequent coating layer is formed, the subsequent coating layer being different than the first coating layer.

8. The method according to claim 7, wherein the method further comprises:
carrying out the step A) by supplying the first precursor to the first coating zone for subjecting the surface of the substrate to the first precursor in the first precursor zone and by supplying the second precursor to the second precursor zone for subjecting the surface of the substrate to the second precursor in the second precursor zone; and one of
carrying out the step C) by supplying the first subsequent precursor to the first coating zone for subjecting the surface of the substrate to the first subsequent precursor in the first precursor zone and by supplying the second precursor to the second precursor zone for subjecting the surface of the substrate to the second precursor in the second precursor zone; or
carrying out the step C) by supplying the first subsequent precursor to the first coating zone for subjecting the surface of the substrate to the first subsequent precursor zone for subjecting the surface of the substrate to the second subsequent precursor in the second precursor zone.

9. The method according to claim 1, wherein the method further comprises a second changing step comprising:
D) replacing the first subsequent precursor in the first precursor zone to the first precursor.

10. The method according to claim 9, wherein the method further comprises:
repeating step A) after step D) for forming two first coating layers; or
repeating steps A), B), C) and D) one or more times for forming two or more first coating layers and two or more subsequent coating layers; or
repeating steps B) and C) one or more times using different subsequent precursors (C, D) in successive repeated steps B) and C) for forming two or more different subsequent coating layers, and repeating steps B) and C) after steps A) and D); or
repeating steps B) and C) one or more times using different subsequent precursors (C, D) in successive repeated steps B) and C) for forming two or more different subsequent coating layers, and repeating steps B) and C) successively without repeating steps A) and D) between successive repeated steps B) and C).

11. The method according to claim 10, wherein the method further comprises:
- using a third precursor as the first subsequent precursor in all of the repeated steps B) and C) for forming the subsequent coating layer in step C); or
- using two or more different precursors as the first subsequent precursor in the repeated steps B) and C) for forming two or more different subsequent coating layers in repeated steps C); or
- using a third precursor as the first subsequent precursor in all of the repeated steps B) and C) and using a fourth precursor as the second subsequent precursor in all of the repeated steps B) and C) for forming the subsequent coating layer in step C); or
- using two or more different precursors as the first subsequent precursor in the repeated steps B) and C) and using two or more different precursors as the second subsequent precursor in the repeated steps B) and C) for forming two or more different subsequent coating layers in repeated steps C).

12. The method according to claim 1, wherein:
- the first changing step further comprises changing the second precursor in the second precursor zone to a second subsequent precursor which is different than the first precursor, the second precursors and the first subsequent precursor (A, B, C); and
- the alternate deposition step further comprises subjecting the surface of the substrate to the first subsequent precursor in the first precursor zone and subjecting the surface of the substrate to the second subsequent precursor in the second precursor zone for forming the subsequent coating layer on the surface of the substrate.

13. The method according to claim 12, wherein the primary deposition step comprises:
A) forming the first coating layer on the surface of the substrate, the forming of the first coating layer comprising sub-steps:
  a) subjecting the surface of the substrate to the first precursor in the first precursor zone;
  b) subjecting the surface of the substrate to the second precursor in the second precursor zone after sub-step a); and
  c) performing sub-steps a) and b) one or more times successively until the first coating layer is formed on the surface of the substrate, the alternate deposition step comprising:
B) replacing the first precursor in the first precursor zone to the first subsequent precursor which is different than the first and second precursors and replacing the second precursor in the second precursor zone to the second subsequent precursor which is different than the first precursor, second precursors and the first subsequent precursor (A, B, C); and
C) forming the subsequent coating layer on the surface of the substrate, the forming of the subsequent coating layer comprising sub-steps:
  d) subjecting the surface of the substrate to the first subsequent precursor in the first precursor zone;
  e) subjecting the surface of the substrate to the second subsequent precursor in the second precursor zone after sub-step d); and
  f) performing sub-steps d) and e) one or more times successively until the subsequent coating layer is formed, the subsequent coating layer being different than the first coating layer.

14. The method according to claim 13, wherein the second changing step comprises:
D) replacing the first subsequent precursor in the first precursor zone to the first precursor and replacing the second subsequent precursor in the second precursor zone to the second precursor.

15. The method according to claim 14, wherein the method further comprises:
- repeating step A) after step D) for forming two first coating layers; or
- repeating steps A), B), C) and D) one or more times for forming two or more first coating layers and two or more subsequent coating layers; or
- repeating steps B) and C) one or more times using different subsequent precursors (C, D) in successive repeated steps B) and C) for forming two or more different subsequent coating layers, and repeating steps B) and C) after steps A) and D); or
- repeating steps B) and C) one or more times using different subsequent precursors (C, D) in successive repeated steps B) and C) for forming two or more different subsequent coating layers, and repeating steps B) and C) successively without repeating steps A) and D) between successive repeated steps B) and C).

16. The method according to claim 1, wherein one of:
- the first precursor and the second precursor are supplied continuously to the first precursor zone and the second precursor zone, respectively, in step A), and the first subsequent precursor and the second precursor is supplied continuously to the first precursor zone and the second precursor zone, respectively, in step C); or
- the first precursor and the second precursor are supplied continuously to the first precursor zone and the second precursor zone, respectively, in step A), and the first subsequent precursor and the second subsequent precursor is supplied continuously to the first precursor zone and the second precursor zone, respectively, in step C).

17. The method according to claim 1, wherein the method further comprises:
- supplying the first precursor in step A) or the first subsequent precursor in step C) via the one or more first precursor nozzles;
- supplying the second precursor or the second subsequent precursor in step A) and C) via the one or more second precursor nozzles; and
- moving the nozzle head over the surface of the substrate in relation to the substrate for subjecting the surface of the first precursor or the first subsequent precursor in the first precursor zone and to the second precursor or the second subsequent precursor in the second precursor zone.

* * * * *